United States Patent
Chen et al.

(10) Patent No.: US 8,604,954 B2
(45) Date of Patent: Dec. 10, 2013

(54) TIMING CALIBRATION CIRCUIT FOR TIME-INTERLEAVED ANALOG-TO-DIGITAL CONVERTER AND ASSOCIATED METHOD

(75) Inventors: Chun-Jen Chen, Zhubei (TW); Tsung-Heng Tsai, Minxiong Township, Chiayi County (TW); Tzu-Yi Tang, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/596,744

(22) Filed: Aug. 28, 2012

(65) Prior Publication Data

US 2013/0241755 A1    Sep. 19, 2013

(30) Foreign Application Priority Data

Mar. 16, 2012    (TW) .............................. 101109192 A

(51) Int. Cl.
*H03M 1/10* (2006.01)
(52) U.S. Cl.
USPC .......................................... 341/120; 341/155
(58) Field of Classification Search
USPC .......................... 341/118, 120, 122, 155, 159
See application file for complete search history.

(56) References Cited

U.S. PATENT DOCUMENTS

| | | | |
|---|---|---|---|
| 4,833,445 A * | 5/1989 | Buchele ........................ | 341/118 |
| 7,301,486 B2 | 11/2007 | Wang et al. | |
| 7,898,446 B2 | 3/2011 | Nagarajan et al. | |
| 7,916,050 B1 | 3/2011 | Mujica et al. | |
| 7,999,708 B2 | 8/2011 | Dyer | |
| 2009/0310716 A1 * | 12/2009 | Yang et al. ..................... | 375/340 |
| 2010/0156682 A1 | 6/2010 | Hung et al. | |
| 2012/0262318 A1 * | 10/2012 | Straayer et al. .............. | 341/120 |
| 2013/0082854 A1 * | 4/2013 | Keane ........................... | 341/120 |

FOREIGN PATENT DOCUMENTS

TW    443037    6/2001

OTHER PUBLICATIONS

English language translation of abstract of TW 443037 (published Jun. 23, 2001).
Haftbaradaran, A., et al.; "A Background Sample-Time Error Calibration Technique Using Random Data for Wide-Band High-Resolution Time-Interleaved ADCs;" IEEE Transactions on Circuits and Systems-II: Express Briefs; vol. 55; No. 3; Mar. 2008; pp. 234-238.

(Continued)

*Primary Examiner* — Peguy Jean Pierre
(74) *Attorney, Agent, or Firm* — McClure, Qualey & Rodack, LLP

(57) ABSTRACT

A timing calibration circuit for a time-interleaved analog-to-digital converter (ADC) is provided. The timing calibration circuit includes a correlation unit, an adaptive filter and a delay cell. The correlation unit generates a first correlation coefficient according to a first zero-crossing possibility distribution between a first digital data and a second digital data, and generates a second correlation coefficient according to a second zero-crossing possibility distribution between the second digital data and a third digital data. The adaptive filter generates a predicted time skew according to a difference between the first correlation coefficient and the second correlation coefficient. The delay cell calibrates a clock signal of the ADC according to the predicted time skew.

21 Claims, 9 Drawing Sheets

(56) References Cited

OTHER PUBLICATIONS

El-Chammas, M., et al.; "A 12-GS/s 81-mW 5-bit Time-Interleaved Flash ADC with Background Timing Skew Calibration;" IEEE Journal of Solid-State Circuits; vol. 46; No. 4; Apr. 2011; pp. 838-847.

Wang, C.Y., et al.; "A Multiphase Timing-Skew Calibration Technique Using Zero-Crossing Detection;" IEEE Transactions on Circuits and Systems-I: Regular Papers; vol. 56; No. 6; Jun. 2009; pp. 1102-1114.

El-Chammas, M., et al.; "General Analysis on the Impact of Phase-Skew in Time-Interleaved ADCs;" IEE Transactions on Circuits and Systems- I: Regular Papers; vol. 56; No. 5; May 2009; pp. 902-910.

Tsai, T.H., et al.; "Bandwidth Mismatch and Its Correction in Time-Interleaved Analog-to-Digital Converters;" IEEE Transactions on Circuits and Systems-II: Express Briefs; vol. 53; No. 10; Oct. 2006; pp. 1133-1137.

Tang, T.Y., et al.; "A Background Timing Mismatch Calibration for Time-Interleaved ADCs;" pp. 1-4.

* cited by examiner

TIMING CALIBRATION CIRCUIT FOR TIME-INTERLEAVED ANALOG-TO-DIGITAL CONVERTER AND ASSOCIATED METHOD

This application claims the benefit of Taiwan application Serial No. 101109192, filed Mar. 16, 2012, the disclosure of which is incorporated by reference herein in its entirety.

TECHNICAL FIELD

The disclosure relates a timing calibration circuit of an analog-to-digital converter (ADC) for a time-interleaved ADC and associated method.

BACKGROUND

Among current ADC structures, a flash ADC and a time-interleaved ADC have highest operating speeds. For high-speed applications, an area and power consumption of the flash ADC are exponentially enlarged as a sampling rate and a resolution increase, whereas the time-interleave ADC satisfies the high-speed applications better than the flash ADC. However, the time-interleaved ADC directly and severely reduces a signal-to-noise ratio (SNR) in the event of timing mismatch, and the SNR degradation worsens even more drastically as the operating speed gets higher. Therefore, there is a need for a solution for increasing the SNR in the event of timing mismatch for the time-interleaved ADC.

SUMMARY

The disclosure is directed to a timing calibration circuit for a time-interleaved analog-to-digital converter (ADC) and associated method.

According to one exemplary embodiment, a timing calibration circuit for a time-interleaved ADC is provided. The timing calibration circuit includes a correlation unit, an adaptive filter and a delay cell. The correlation unit is coupled to a first ADC, a second ADC and a third ADC. The first ADC, the second ADC and the third ADC respectively output a first digital data, a second digital data and a third digital data. The correlation generates a first correlation coefficient according to a first zero-crossing possibility distribution between the first digital data and the second digital data, and generates a second correlation coefficient according to a second zero-crossing possibility distribution between the second digital data and the third digital data. The adaptive filter, coupled to the correlation unit, generates a predicted time skew according to a coefficient variance between the first correlation coefficient and the second correlation coefficient. The delay cell, coupled to the adaptive filter, calibrates a clock signal of the second analog ADC according to the predicted time skew.

According to another exemplary embodiment, a timing calibration method for a time-interleaved ADC is provided. The method include steps of: receiving a first digital data, a second digital data and a third digital data respectively outputted by a first ADC, a second ADC and a third ADC; generating a first correlation coefficient according to a first zero-crossing possibility distribution between the first digital and the second digital data, and generating a second correlation coefficient according to a second zero-crossing possibility distribution between the second digital data and the third digital data; generating a predicted time skew according to a coefficient variance between the first correlation coefficient and the second correlation coefficient; and calibrating a clock signal of the second ADC according to the predicted time skew.

Figure 1:
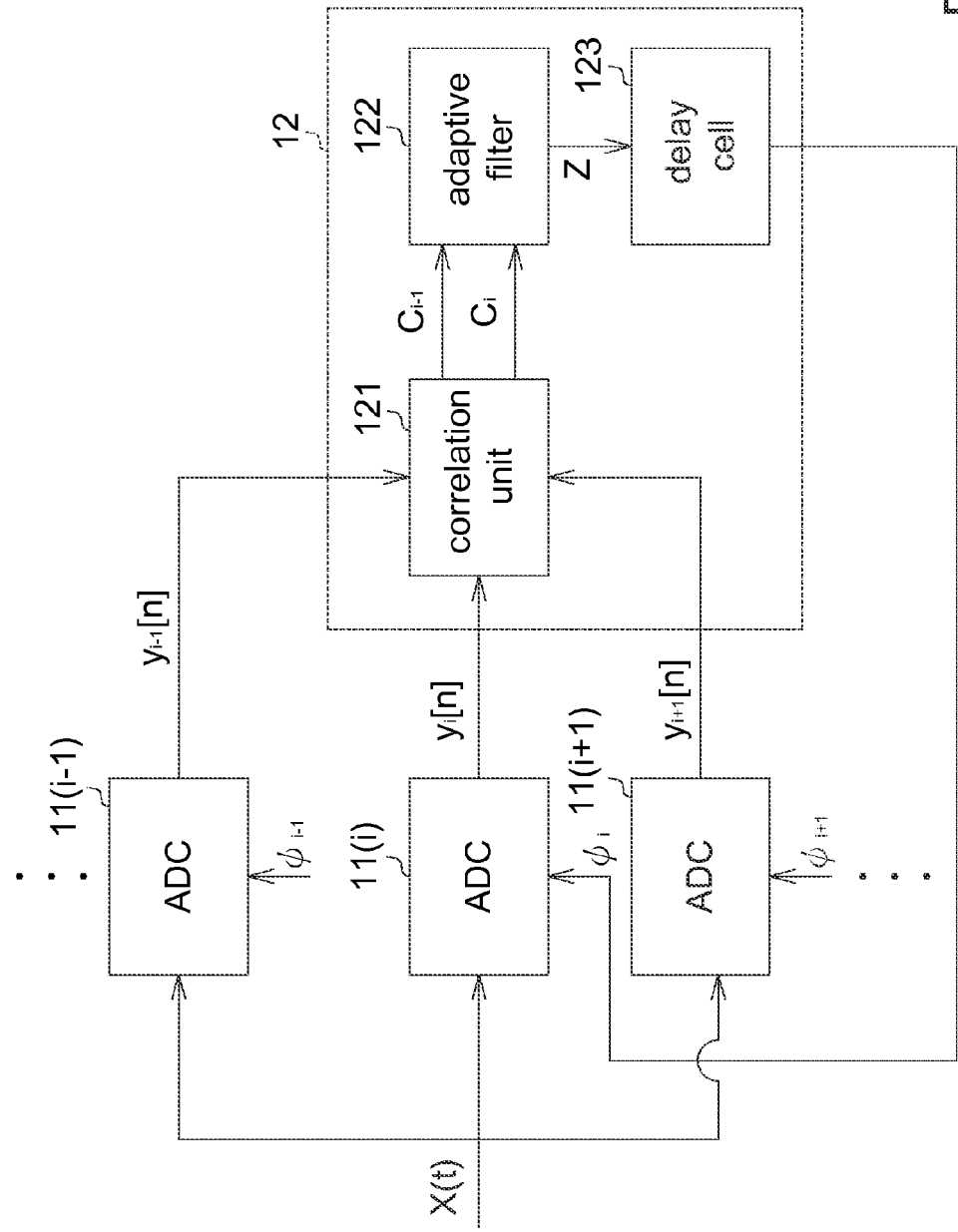
FIG. 1 is a partial schematic diagram of a time-interleaved ADC.

In the following detailed description, for purposes of explanation, numerous specific details are set forth in order to provide a thorough understanding of the disclosed exemplary embodiments. It will be apparent, however, that one or more exemplary embodiments may be practiced without these specific details. In other instances, well-known structures and devices are schematically shown in order to simplify the drawing.

DETAILED DESCRIPTION

Figure 2:
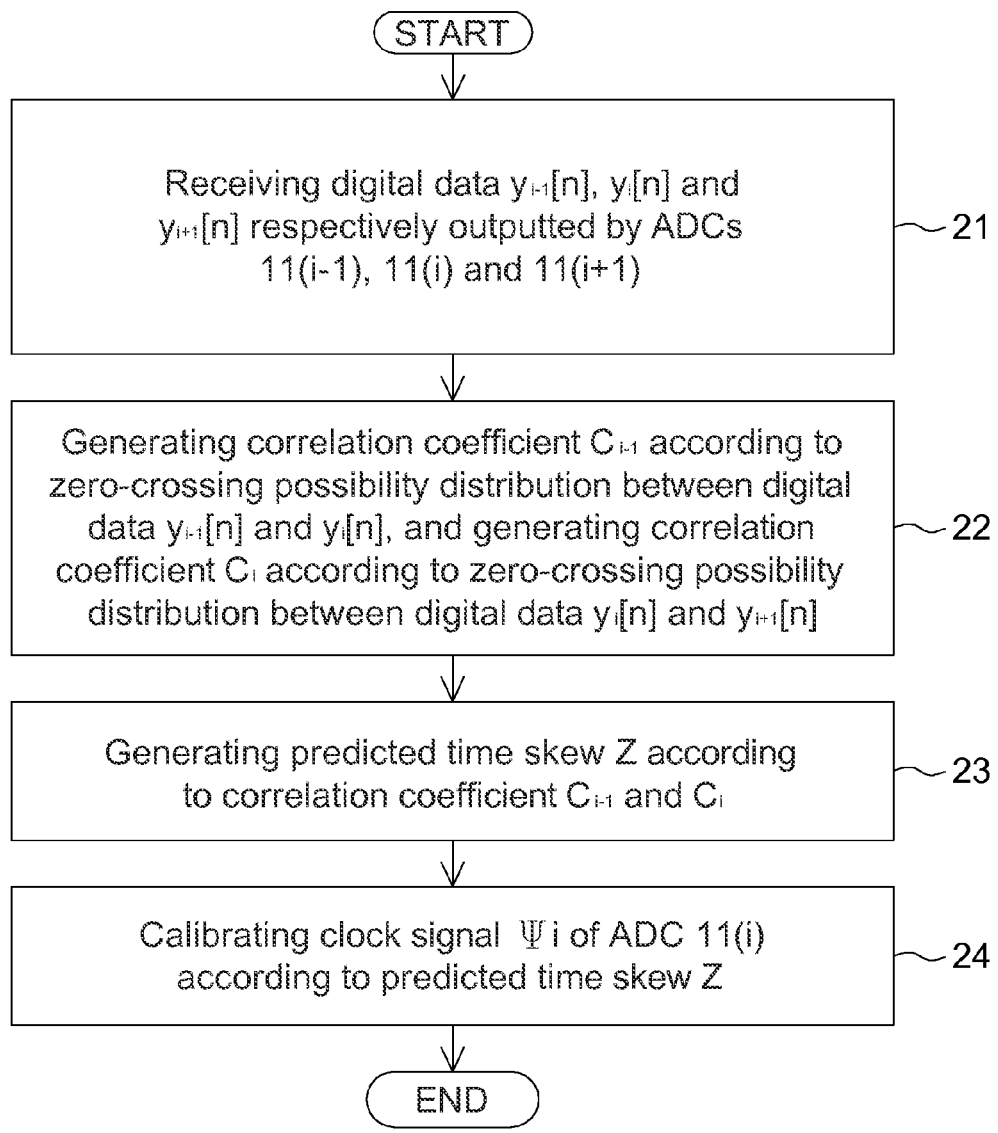
FIG. 2 is a flowchart of a timing calibration method for a time-interleaved ADC.

FIG. 1 shows a partial schematic diagram of a time-interleaved analog-to-digital converter (ADC). FIG. 2 shows a flowchart of a timing calibration method for a time-interleaved ADC. A time-interleaved ADC 1 includes a several ADCs and a timing calibration circuit 12. For illustrative purposes, an ADC 11($i$−1), an ADC 11($i$) and an ADC 11($i$+1) are taken as examples of the ADCs. It should be noted that, for a person skilled in the rated art, a quantity of the ADCs can be adaptively adjusted according actual application requirements. The ADCs 11($i$−1), 11($i$) and 11($i$+1), respectively controlled by a clock signal $\Psi_{i-1}$, a clock signal $\Psi_i$ and a clock signal $\Psi_{i+1}$, alternately sample an analog data x(t) and analog-to-digital convert the sampled analog signal. After the analog-to-digital converting the sampled analog data, the ADCs 11($i$−1), 11($i$) and 11($i$+1) respectively output digital data $y_{i-1}[n]$, $y_i[n]$ and $y_{i+1}[n]$.

The timing calibration circuit 12 includes a correlation unit 121, an adaptive filter 122 and a delay cell 123. For example, the correlation unit 121 and the adaptive filter 122 are implemented by a hardware circuit or a processor executing an algorithm. For example, the delay cell 123 is implemented by an inverter. The correlation unit 121 is coupled to the ADCs 11($i$−1), 11($i$) and 11($i$+1), the adaptive filter 122 is coupled to the correlation unit 121, and the delay cell 123 is coupled to the adaptive filter 122.

A timing calibration method for the time-interleaved ADC 1 is applicable to the foregoing timing calibration circuit 12, and includes the following steps. In Step 21, the correlation unit 121 receives the digital data $y_{i-1}[n]$, $y_i[n]$ and $y_{i+1}[n]$ respectively outputted by the ADCs 11($i$−1), 11($i$) and 11($i$+1). In Step 22, the correlation unit 121 generates a correlation coefficient $C_{i-1}$ according a zero-crossing possibility distribution between the digital data $y_{i-1}[n]$ and $y_i[n]$, and generates a correlation coefficient $C_i$ according a zero-crossing possibility distribution between the digital data $y_i[n]$ and $y_{i+1}[n]$. The so-called zero-crossing is not limited to zero-crossing. For example, a signal changes up and down on the basis of a non-zero reference value. When a signal level drops below the reference value from a value above the reference value, a positive zero-crossing is formed. Alternatively, when the signal level increases to above the reference value from a value below the reference, a negative zero-crossing is formed. In Step 23, the adaptive filter 23 generates a predicted time skew Z according to a coefficient variance between the correlation coefficient $C_{i-1}$ and the correlation coefficient $C_i$. In Step 24, the delay cell 123 feeds back and calibrates the clock signal $\Psi_i$ of the ADC 11(i) according to the predicted time skew Z. It should be noted that, the calibration on the clock signal $\Psi_i$ of the ADC 11(i) is taken as an illustrative example. In another exemplary embodiment, through similar approaches, the clock signal $\Psi_{i-1}$ of the ADC 11(i−1) and the clock signal $\Psi_{i+1}$ of the ADC 11(i+1) may also be fed back and altogether calibrated.

Figure 3:
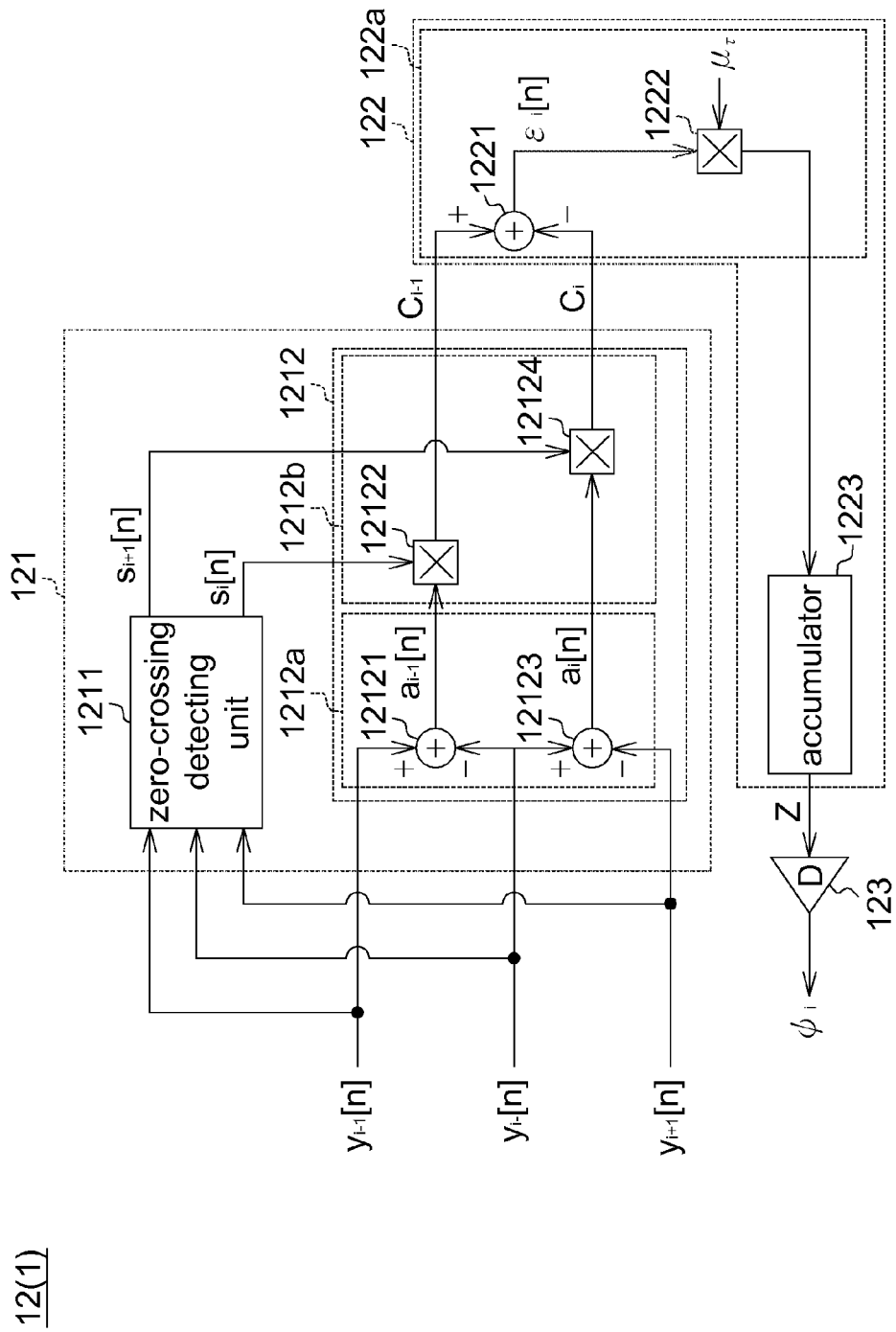
FIG. 3 is a block diagram of a timing calibration circuit according to an exemplary embodiment.

FIG. 3 shows a block diagram of a timing calibration circuit according to the exemplary embodiment. Referring to FIGS. 1 and 3, the foregoing timing calibration circuit 12 is exemplified by a timing calibration circuit 12(1). The correlation circuit 121 includes a zero-crossing detecting unit 1211 and a coefficient calculating unit 1212. The zero-crossing detecting unit 1211 generates a zero-crossing symbol $S_i[n]$ according to the digital data $y_{i-1}[n]$ and $y_i[n]$, and generates a zero-crossing symbol $S_{i+1}[n]$ according to the digital data $y_i[n]$ and $y_{i+1}[n]$. The coefficient calculating unit 1212 calculates the correlation coefficient $C_{i-1}$ according a data variance $a_{i-1}[n]$ between the digital data $y_{i-1}[n]$ and $y_i[n]$ and the zero-crossing symbol $S_i[n]$, and calculates the correlation coefficient $C_i$ according to a data variance $a_i[n]$ between the $y_i[n]$ and $y_{i+1}[n]$ and the zero-crossing symbol $S_{i+1}[n]$.

When a positive zero-crossing occurs between the digital data $y_{i-1}[n]$ and $y_i[n]$, the zero-crossing symbol $S_i[n]$ is a positive number, or is represented by +1. When a negative zero-crossing occurs between the digital data $y_{i-1}[n]$ and $y_i[n]$, the zero-crossing symbol $S_i[n]$ is a negative number, or is represented by −1. When no zero-crossing occurs between the digital data $y_{i-1}[n]$ and $y_i[n]$, the zero-crossing symbol $S_i[n]$ equals 0. Similarly, when a zero-crossing occurs between the digital data $y_i[n]$ and $y_{i+1}[n]$, the zero-crossing symbol $S_{i+1}[n]$ is represented by +1 or −1; when no zero-crossing occurs between the digital data $y_i[n]$ and $y_{i+1}[n]$, the zero-crossing symbol $S_{i+1}[n]$ equals 0.

The coefficient calculating unit 1212 includes an adding unit 1212a and a multiplying unit 1212b. The adding unit 1212a substrates the digital data $y_i[n]$ from the digital data $y_{i-1}[n]$ to generate the data variance $a_{i-1}[n]$, and substrates the digital data $y_{i+1}[n]$ from the digital data $y_i[n]$ to generate the data variance $a_i[n]$. The multiplying unit 1212b multiples the data variance $a_{i-1}[n]$ by the zero-crossing symbol $S_i[n]$ to generate the correlation coefficient $C_{i-1}$, and multiples the data variance $a_i[n]$ by the zero-crossing symbol $S_{i+1}[n]$ to generate the correlation coefficient $C_i$.

Further, the adding unit 1212a includes an adder 12121 and an adder 12123. The multiplying unit 1212b includes a multiplier 12122 and a multiplier 12124. The adder 12121 substrates the digital data $y_i[n]$ from the digital data $y_{i-1}[n]$ to generate the data variance $a_{i-1}[n]$, and the multiplier 12122 multiplies the data variance $a_{i-1}[n]$ by the zero-crossing symbol $S_i[n]$ to generate the correlation coefficient $C_{i-1}$. The adder 12123 substrates the digital data $y_{i+1}[n]$ from the digital data $y_i[n]$ to generate the data variance $a_i[n]$, and the multiplier 12124 multiplies the data variance $a_i[n]$ by the zero-crossing symbol $S_i+[n]$ to generate the correlation coefficient $C_i$. In another exemplary embodiment, the adding unit 1212a may be implemented by a subtracting unit, and the adders 12121 and 12123 may be implemented by substractors.

For example, the adaptive filter 122 is a least-mean-square (LMS) filter. When the adaptive filter 122 is implemented by an LMS filter, a coefficient variance $\epsilon_i$ between the correlation coefficients $C_{i-1}$ and $C_i$ is converged by an LMS loop. The LMS loop may be represented by $\tau_i[n+1]=\tau_i[n]+\mu_\tau \epsilon_i[n]$. Wherein, $\tau_i[n+1]$ represents the predicated time skew, and $\tau_i[n]$ represents a current time skew.

The adaptive filter 122 includes a product calculating unit 122a and an accumulator 1223. The product calculating unit 122a substrates the correlation coefficient $C_i$ from the correlation coefficient $C_{i-1}$ to generate the coefficient variance $\epsilon_i[n]$, and multiples the coefficient variance $\epsilon_i[n]$ by an update step size $\mu_\tau$ to generate a product. The accumulator 1223 outputs the predicted time skew Z according to the product, so that the delay cell 123 calibrates the clock signal $\Psi_i$ of the ADC 11(i) according to the predicted time skew Z. Further, the product calculating unit 122a includes an adder 1221 and a multiplier 1222. The adder 1221 substrates the correlation coefficient $C_i$ from the correlation coefficient $C_{i-1}$ to generate the coefficient variance $\epsilon_i[n]$, and the multiplier 1222 multiples the coefficient variance $\epsilon_i[n]$ by the update step size $\mu_\tau$ to generate the product. In an alternative exemplary embodiment, the adder 1221 may be implemented by a substractor.

Figure 4:
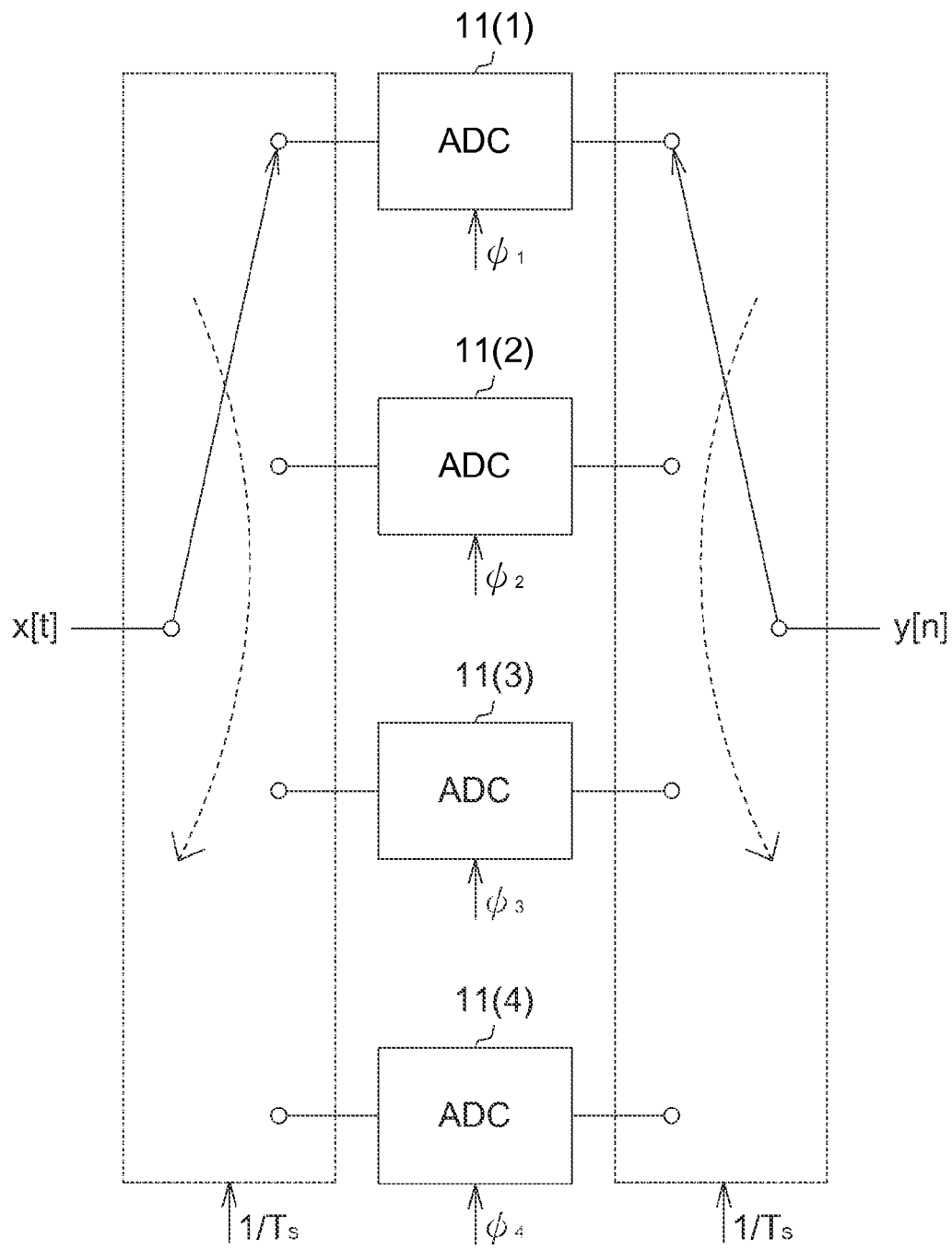
FIG. 4 is a partial schematic diagram of a time-interleaved ADC including four ADCs.
Figure 5:
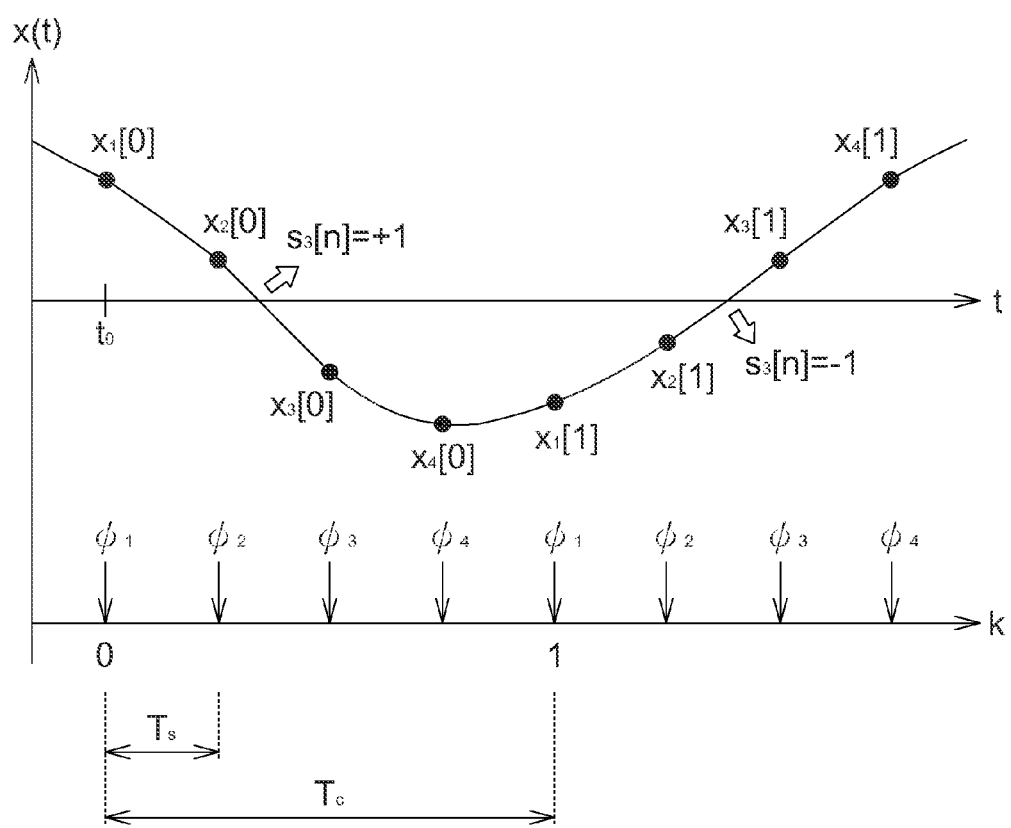
FIG. 5 is a schematic diagram of four ADCs sampling analog data.

FIG. 4 shows a partial schematic diagram of a time-interleaved ADC including four ADCs. FIG. 5 shows a schematic diagram of the four ADCs sampling analog data. The time-interleaved ADC in FIG. 4 includes an ADC 11(1), an ADC 11(2), an ADC 11(3) and an ADC 11(4). A total sampling time of the ADCs 11(1), 11(2), 11(3) and 11(4) equals a clock period Tc. The ADCs 11(1), 11(2), 11(3) and 11(4) alternately sample the analog data x[t] according to a sampling time Ts, respectively, to output the digital data y[n].

Further, the ADC 11(1) is controlled by the clock signal $\Psi_1$ to sample an analog data x1[0] and an analog data x1[1], the ADC 11(2) is controlled by the clock signal $\Psi_2$ to sample an analog data x2[0] and an analog data x2[1], the ADC 11(3) is controlled by the clock signal $\Psi_3$ to sample an analog data x3[0] and an analog data x3[1], and the ADC 11(4) is controlled by the clock signal $\Psi_4$ to sample an analog data x4[0] and an analog data x4[1]. When a zero-crossing occurs between the clock signal $\Psi_2$ and the clock signal $\Psi_3$, a zero-crossing symbol $S_3[n]$ generated by the zero-crossing detecting unit equals +1 or −1.

Figure 6:
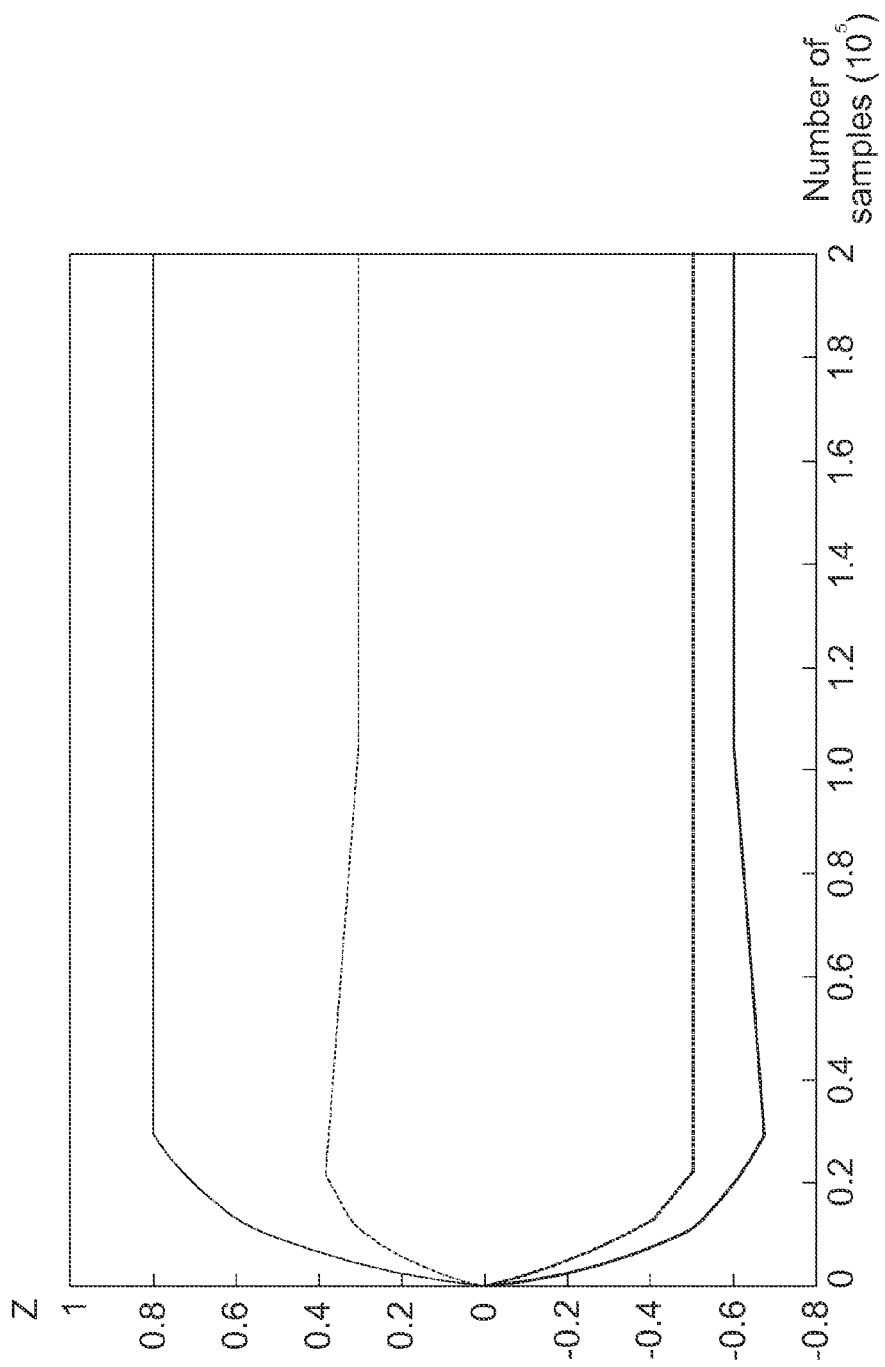
FIG. 6 is a schematic diagram of a predicted time skew outputted by an accumulator according to the exemplary embodiment.
Figure 7:
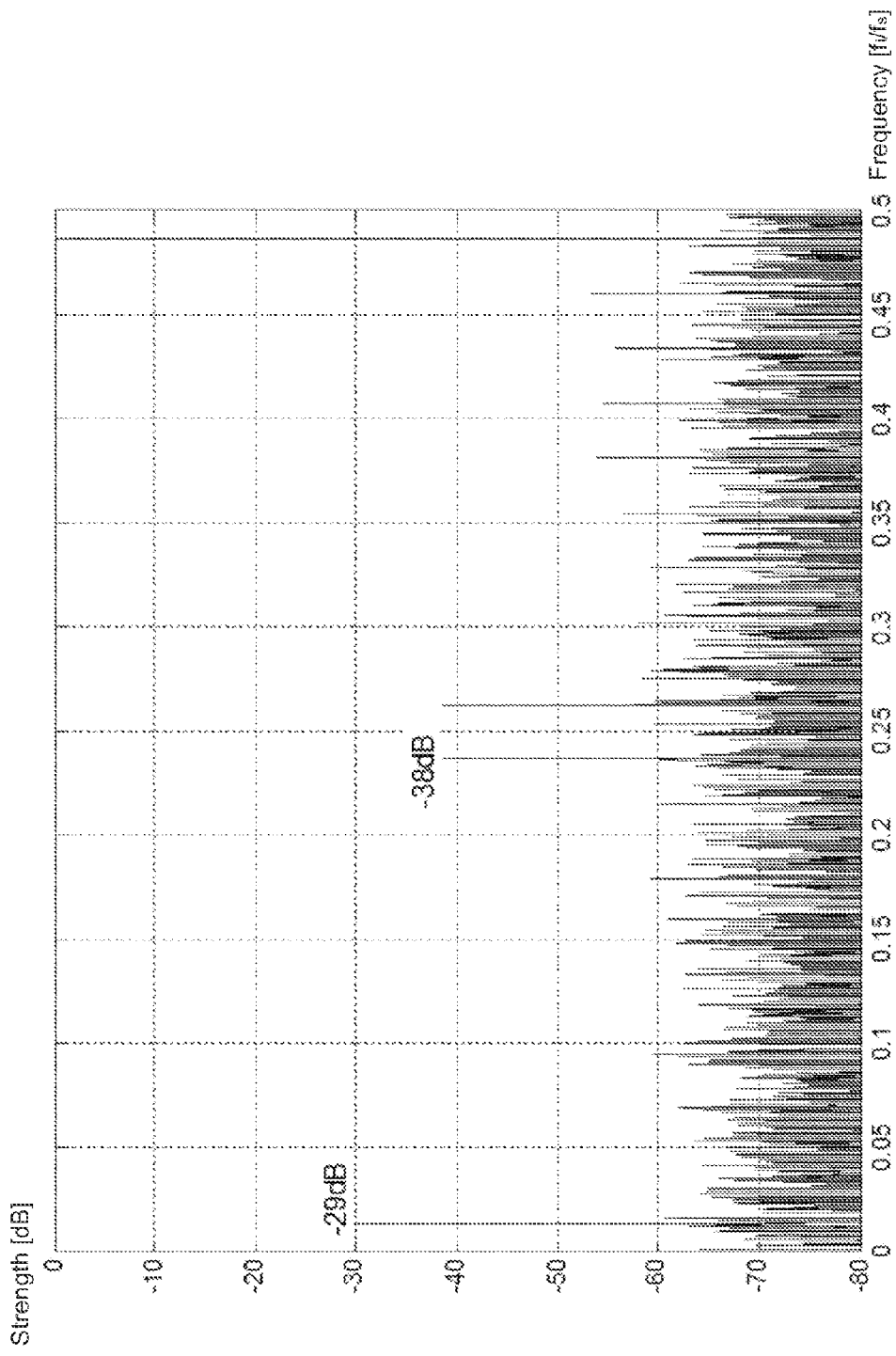
FIG. 7 is an output frequency spectrum of a clock signal of a time-interleave ADC before calibration.
Figure 8:
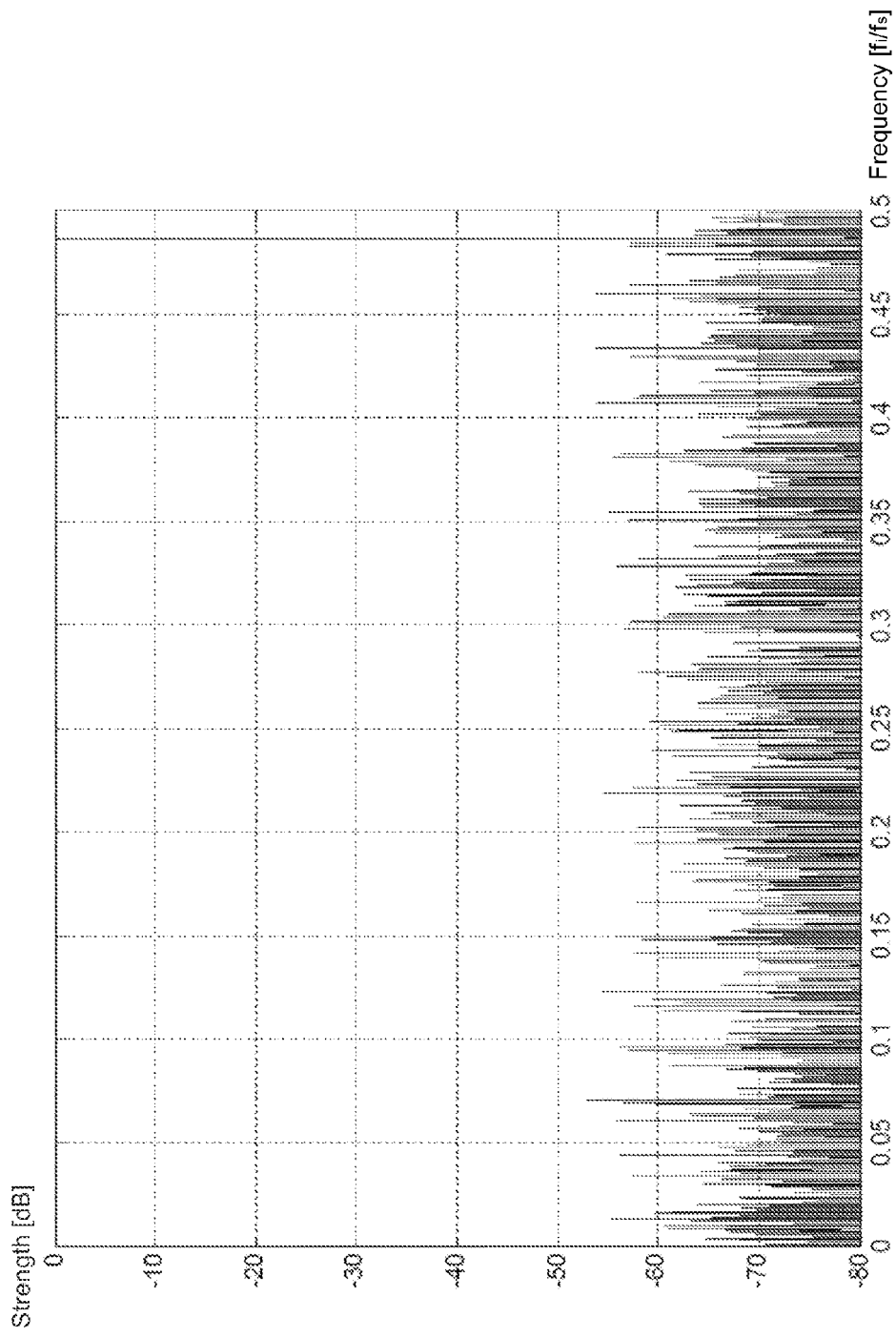
FIG. 8 shows an output frequency spectrum of a clock signal calibrated according to the exemplary embodiment.

FIG. 6 shows a schematic diagram of a predicted time skew outputted by the accumulator in the exemplary embodiment. FIG. 7 shows an output frequency spectrum of a clock signal of a time-interleave ADC before calibration. FIG. 8 shows an output frequency spectrum of a clock signal calibrated according to the exemplary embodiment. In FIG. 6, the time skew of a time-interleaved ADC including four ADCs is taken as an illustrative example, and the time skew is assumed to be −2 ps (−0.2%), 7 ps (0.7%), −1.9 ps (0.19%) and 2.3 ps (0.23%). From FIG. 6, it is observed that the predicted time skew Z outputted by the accumulator is converted to a constant. When the foregoing LMS loop starts converging, the time skew is reduced and a sampling interval between the ADCs is adjusted to the sampling time Ts.

It is clearly seen from FIG. 7 that, the clock signal of the time-interleaved ADC has apparent surges, one of which even has a strength reaching up to −29 dB. It is then clearly seen from FIG. 8 that, after the clock signal of the time-interleaved ADC is calibrated by the exemplary embodiment, the surges are eliminated such that the overall SNR and an effective number of bits (ENOB) are increased.

Exemplary Embodiment

Figure 9:
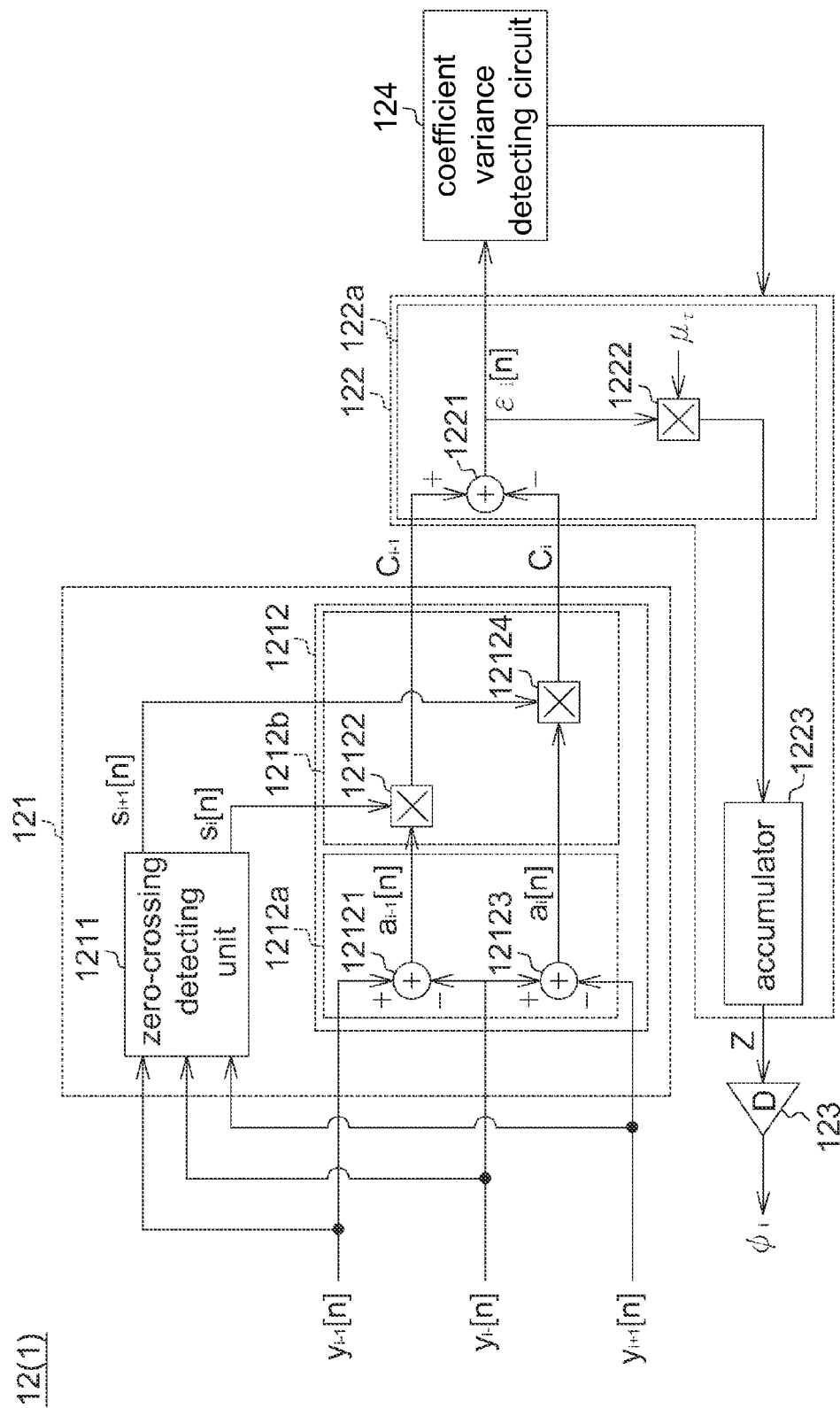
FIG. 9 is a block diagram of a timing calibration circuit according to an exemplary embodiment.

FIG. 9 shows a block diagram of a timing calibration circuit according to an exemplary embodiment. There is a difference between the above exemplary embodiments is that, in addition the correlation unit 121, the adaptive filter 122 and the delay cell 123, a timing calibration circuit 12(2) in this exemplary embodiment further includes a coefficient variance detecting circuit 124. The coefficient variance detecting circuit 124 detects the coefficient variance $\epsilon_i$, and appropriately deactivates the adaptive filter 122 when the coefficient variance $\epsilon_i$ is smaller than a threshold. Conversely, when the coefficient variance $\epsilon_i$ is not smaller than the threshold, the coefficient variance detecting circuit 124 appropriately activates the adaptive filter 122.

It will be apparent to those skilled in the art that various modifications and variances can be made to the disclosed exemplary embodiments. It is intended that the specification and examples be considered as exemplary only, with a true scope of the disclosure being indicated by the following claims and their equivalents.

What is claimed is:

1. A timing calibration circuit for a time-interleaved analog-to-digital converter (ADC), comprising:
    a correlation unit, coupled to a first ADC, a second ADC and a third ADC, the first ADC, the second ADC and the third ADC respectively outputting a first digital data, a second digital data and a third digital data; the correlation unit generating a first correlation coefficient according to a first zero-crossing possibility distribution between the first digital data and the second digital data, and generating a second correlation coefficient according to a second zero-crossing possibility distribution between the second digital data and the third digital data;
    an adaptive filter, coupled to the correlation unit, for generating a predicted time skew according to a coefficient variance between the first correlation coefficient and the second correlation coefficient; and
    a delay cell, coupled to the adaptive filter, for calibrating a clock signal of the second ADC according to the predicted time skew.

2. The timing calibration circuit according to claim 1, wherein the correlation unit comprises:
    a zero-crossing detecting unit, for generating a first zero-crossing symbol according to the first digital data and the second digital data, and generating a second zero-crossing symbol according to the second digital data and the third digital data; and
    a coefficient calculating unit, for calculating the first correlation coefficient according to a first data variance between the first digital data and the second digital data and the first zero-crossing symbol, and calculating the second correlation coefficient according to a second data variance between the second digital data and the third digital data and the second zero-crossing symbol.

3. The timing calibration circuit according to claim 2, wherein when a zero-crossing occurs between the first digital data and the second digital data, the first zero-crossing symbol equals +1 or −1; when no zero-crossing occurs between the first digital data and the second digital data, the first zero-crossing symbol equals 0.

4. The timing calibration circuit according to claim 2, wherein when a zero-crossing occurs between the second digital data and the third digital data, the second zero-crossing symbol equals +1 or −1; when no zero-crossing occurs between the second digital data and the third digital data, the second zero-crossing symbol equals 0.

5. The timing calibration circuit according to claim 2, wherein the coefficient calculating unit comprises:
    an adding unit, for subtracting the second digital data from the first digital data to generate the first data variance, and subtracting the third digital data from the second digital data to generate the second data variance; and
    a multiplying unit, for multiplying the first data variance by the first zero-crossing symbol to generate the first correlation coefficient, and multiplying the second data variance by the second zero-crossing symbol to generate the second correlation coefficient.

6. The timing calibration circuit according to claim 2, wherein the coefficient calculating unit comprises:
    a subtracting unit, for subtracting the second digital data from the first digital data to generate the first data variance, and subtracting the third digital data from the second digital data to generate the second data variance; and
    a multiplying unit, for multiplying the first data variance by the first zero-crossing symbol to generate the first correlation coefficient, and multiplying the second data variance by the second zero-crossing symbol to generate the second correlation coefficient.

7. The timing calibration circuit according to claim 2, wherein the adaptive filter comprises:
    a product calculating unit, for subtracting the second correlation coefficient from the first correlation coefficient to generate the coefficient variance, and multiplying the coefficient variance by an update step size to generate a product; and
    an accumulator, for outputting a clock adjusting signal according to the product.

8. The timing calibration circuit according to claim 1, wherein the adaptive filter is a least-mean-square (LMS) filter.

9. The timing calibration circuit according to claim 8, wherein the coefficient variance is converged by an LMS loop.

10. The timing calibration circuit according to claim 1, further comprising:
    a coefficient variance detecting circuit, for detecting the coefficient variance, and deactivating the adaptive filter when the coefficient variance is smaller than a threshold.

11. The timing calibration circuit according to claim 10, wherein the coefficient variance detecting circuit activates the adaptive filter when the coefficient variance is not smaller than the threshold.

12. A timing calibration method for a time-interleaved ADC, comprising:
    receiving a first digital data, a second digital data and a third digital data respectively outputted by a first ADC, a second ADC and a third ADC;
    generating a first correlation coefficient according to a first zero-crossing possibility distribution between the first digital data and the second digital data, and generating a second correlation coefficient according to a second zero-crossing possibility distribution between the second digital data and the third digital data;
    generating a predicted time skew according to a coefficient variance between the first correlation coefficient and the second correlation coefficient; and
    calibrating a clock signal of the second ADC according to the predicted time skew.

13. The timing calibration method according to claim 12, wherein the step of generating a correlation coefficients comprises:
generating a first zero-crossing symbol according to the first digital data and the second digital data, and generating a second zero-crossing symbol according to the second digital data and the third digital data;
calculating the first correlation coefficient according to a first data variance between the first digital data and the second digital data and the first zero-crossing symbol, and calculating the second correlation coefficient according to a second data variance between the second digital data and the third digital data and the second zero-crossing symbol.

14. The timing calibration method according to claim 13, wherein when a zero-crossing occurs between the first digital data and the second digital data, the first zero-crossing symbol equals +1 or −1; when no zero-crossing occurs between the first digital data and the second digital data, the first zero-crossing symbol equals 0.

15. The timing calibration method according to claim 13, wherein when a zero-crossing occurs between the second digital data and the third digital data, the second zero-crossing symbol equals +1 or −1; when no zero-crossing occurs between the second digital data and the third digital data, the second zero-crossing symbol equals 0.

16. The timing calibration method according to claim 13, wherein the step of calculating the correlation coefficients comprises:
subtracting the second digital data from the first digital data to generate the first data variance, and subtracting the third digital data from the second digital data to generate the second data variance; and
multiplying the first data variance by the first zero-crossing symbol to generate the first correlation coefficient, and multiplying the second data variance by the second zero-crossing symbol to generate the second correlation coefficient.

17. The timing calibration method according to claim 13, wherein the step of generating the predicted time skew comprises:
subtracting the second correlation coefficient from the first correlation coefficient to generate the coefficient variance, and multiplying the coefficient variance by an update step size to generate a product; and
outputting a clock adjusting signal according to the product.

18. The timing calibration method according to claim 12, wherein the coefficient variance is generated by an LMS filter.

19. The timing calibration method according to claim 18, wherein the coefficient variance is converged by an LMS loop.

20. The timing calibration method according to claim 12, further comprising:
detecting the coefficient variance;
wherein, a calculation for the predicted time skew is stopped when the coefficient variance is smaller than a threshold.

21. The timing calibration method according to claim 12, further comprising:
detecting the coefficient variance;
wherein, a calculation for the predicted time skew is performed when the coefficient variance is not smaller than a threshold.

* * * * *